(12) United States Patent
Kai et al.

(10) Patent No.: US 11,337,306 B2
(45) Date of Patent: May 17, 2022

(54) SEMICONDUCTOR DEVICE

(71) Applicant: FUJI ELECTRIC CO., LTD., Kawasaki (JP)

(72) Inventors: Kenshi Kai, Matsumoto (JP); Rikihiro Maruyama, Matsumoto (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 23 days.

(21) Appl. No.: 17/134,972

(22) Filed: Dec. 28, 2020

(65) Prior Publication Data

US 2021/0251075 A1 Aug. 12, 2021

(30) Foreign Application Priority Data

Feb. 7, 2020 (JP) .............................. JP2020-019373

(51) Int. Cl.
| | |
|---|---|
| *H05K 1/11* | (2006.01) |
| *H05K 1/00* | (2006.01) |
| *H05K 1/05* | (2006.01) |
| *H01L 25/07* | (2006.01) |
| *H01L 23/498* | (2006.01) |
| *H01L 23/14* | (2006.01) |
| *H05K 1/02* | (2006.01) |

(52) U.S. Cl.
CPC ........... *H05K 1/053* (2013.01); *H01L 23/142* (2013.01); *H01L 23/49838* (2013.01); *H01L 25/072* (2013.01); *H05K 1/00* (2013.01); *H05K 1/117* (2013.01); *H05K 1/02* (2013.01); *H05K 1/0271* (2013.01); *H05K 2201/09145* (2013.01)

(58) Field of Classification Search
CPC .. H05K 1/00; H05K 1/053; H05K 1/11–1/119
See application file for complete search history.

(56) References Cited

U.S. PATENT DOCUMENTS

| 5,527,620 A | 6/1996 | Schulz-Harder |
| 2016/0079152 A1 | 3/2016 | Obara |

FOREIGN PATENT DOCUMENTS

| JP | 2005-011862 A | 1/2005 |
| JP | 2010-232545 A | 10/2010 |
| JP | 2016-058595 A | 4/2016 |

*Primary Examiner* — Jeremy C Norris
(74) *Attorney, Agent, or Firm* — Rabin & Berdo, P.C.

(57) ABSTRACT

A semiconductor device including an insulated circuit board. The insulated circuit board includes an insulating board having an outer edge and a plurality of corners, and a plurality of circuit patterns formed on a front surface of the insulating board. The plurality of circuit patterns have a plurality of outer-edge corners facing the outer edge of the insulating board, among which outer-edge corners corresponding to the corners of the insulating board are smaller in curvature than outer-edge corners that do not correspond to the corners of the insulating board.

12 Claims, 5 Drawing Sheets

SEMICONDUCTOR DEVICE

CROSS-REFERENCE TO RELATED APPLICATION

This application is based upon and claims the benefit of priority of the prior Japanese Patent Application No. 2020-019373, filed on Feb. 7, 2020, the entire contents of which are incorporated herein by reference.

BACKGROUND OF THE INVENTION

1. Field of the Invention

The embodiments discussed herein relate to a semiconductor device.

2. Background of the Related Art

Semiconductor devices including power devices are used as power conversion devices. For example, the power devices are semiconductor chips including IGBTs (insulated gate bipolar transistors) and power MOSFETs (metal oxide semiconductor field effect transistors). Such a semiconductor device includes these semiconductor chips and an insulated circuit board to which the semiconductor chips are soldered. The insulated circuit board includes an insulating board, a plurality of circuit patterns formed on the insulating board, and a metal plate formed on the rear surface of the insulating board. Each semiconductor chip is soldered to one of the plurality of circuit patterns.

In the insulated circuit board of the semiconductor device, thermal cycles induce stress due to the difference of thermal expansion coefficient between the insulating board and the plurality of circuit patterns, and concentration of the stress may cause a damage such a crack in the insulating board. To deal with this problem, there has been proposed the following techniques, for example. A circuit pattern and a metal plate are provided on an insulating board in such a manner that the end faces of a corner of the circuit pattern and the end faces of a corner of the metal plate match in plan view, and the curvature of the corner of the circuit pattern is made larger than that of the corner of the metal plate (For example, Japanese Laid-open Patent Publication No. 2005-011862). Alternatively, a circuit pattern and a metal plate are provided on an insulating board in such a manner that the end faces of a corner of the circuit pattern are located inside the end faces of a corner of the metal plate in plan view, and the curvature of the corner of the circuit pattern is made larger than that of the corner of the metal plate (for example, Japanese Laid-open Patent Publication No. 2005-011862).

Note that, in the case where a heat dissipation plate is soldered to the rear surface of a metal plate in an insulated circuit board in a semiconductor device, stress may be concentrated on the interface between the solder and the metal plate over time. To deal with this, there has been proposed a technique in which the area of a circuit pattern is made smaller than that of the metal plate and at least one of the corners of the circuit pattern is made to match with the corresponding corner of the metal plate in plan view (for example, Japanese Laid-open Patent Publication No. 2010-232545).

For semiconductor devices, various techniques have been proposed for preventing concentration of stress. Nonetheless, stress is concentrated on an insulated circuit board, depending on the number, shapes, and locations of circuit patterns, which causes a damage in the insulated circuit board. The damage in the insulated circuit board decreases the reliability of the semiconductor device. For this reason, various techniques that contribute to solving such problems are demanded.

SUMMARY OF THE INVENTION

According to one aspect, there is provided a semiconductor device, including: an insulated circuit board, including an insulating board having an outer edge and a plurality of corners, and a plurality of circuit patterns formed on a front surface of the insulating board, the plurality of circuit patterns having a plurality of outer-edge corners facing the outer edge of the insulating board, among which outer-edge corners corresponding to the corners of the insulating board are smaller in curvature than outer-edge corners that do not correspond to the corners of the insulating board.

The object and advantages of the invention will be realized and attained by means of the elements and combinations particularly pointed out in the claims.

It is to be understood that both the foregoing general description and the following detailed description are exemplary and explanatory and are not restrictive of the invention.

DETAILED DESCRIPTION OF THE INVENTION

Hereinafter, preferred embodiments will be described with reference to the accompanying drawings. In the following description, the terms "front surface" and "upper surface" represent surfaces facing up in the semiconductor device 50 of FIG. 1. Similarly, the term "up" represents an upward direction in the semiconductor device 50 of FIG. 1. The terms "rear surface" and "lower surface" represent surfaces facing down in the semiconductor device 50 of FIG. 1. The term "down" represents a downward direction in the semiconductor device 50 of FIG. 1. The same directionality applies to the other drawings, as appropriate. The terms "front surface," "upper surface," "up," "rear surface," "lower surface," "down," and "side surface" are used for convenience to describe relative positional relationships, and do not limit the technical ideas of the embodiments. For example, the terms "up" and "down" do not always represent the vertical direction to the ground. That is, the "up" and "down" directions are not limited to the gravity direction. In addition, a curvature (1/r) is an average value at the corner formed by two sides. In addition, a curvature radius (r) is the reciprocal of the curvature.

First Embodiment

Figure 1:
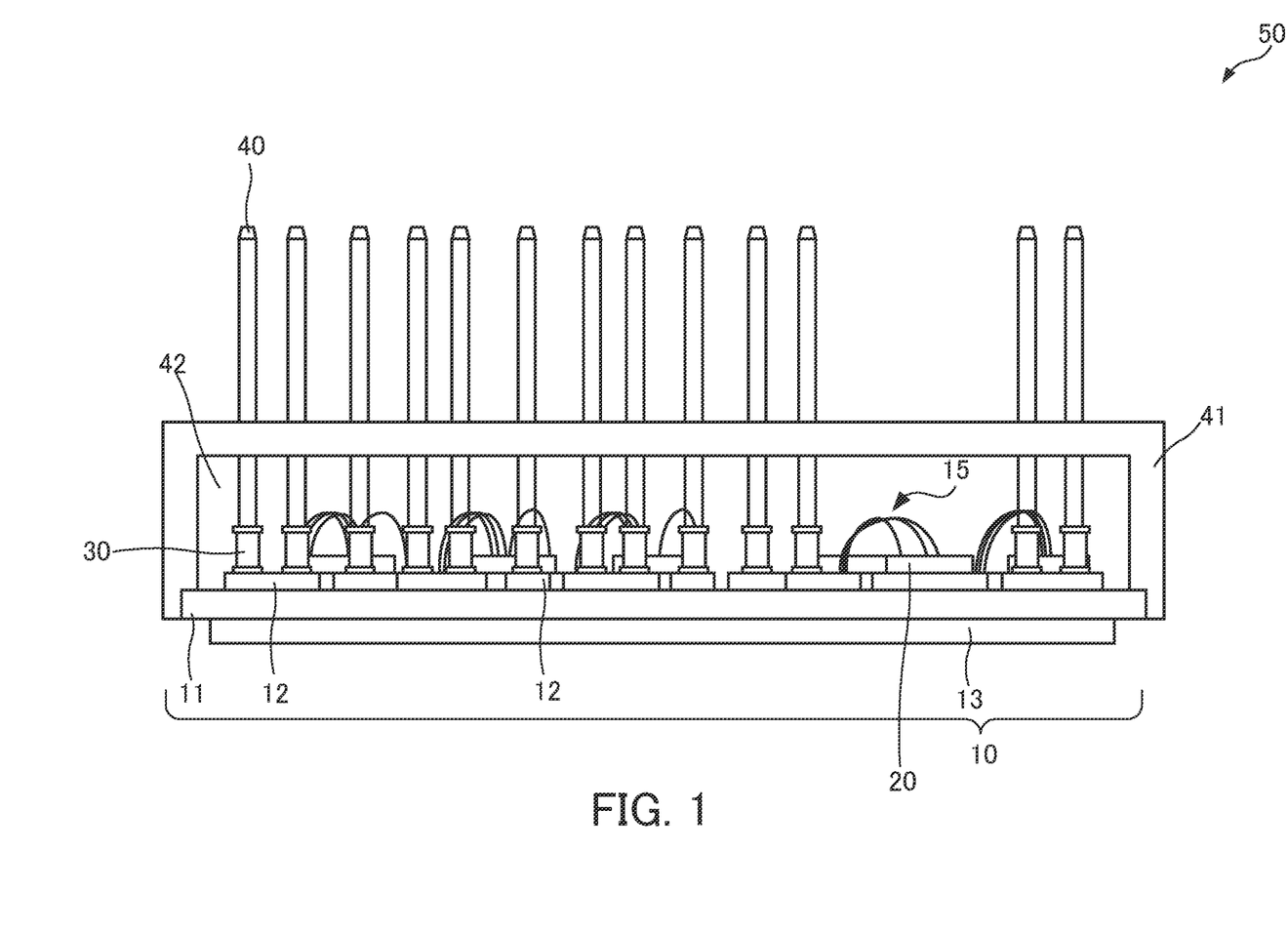
FIG. 1 is a side sectional view of a semiconductor device according to a first embodiment.
Figure 2:
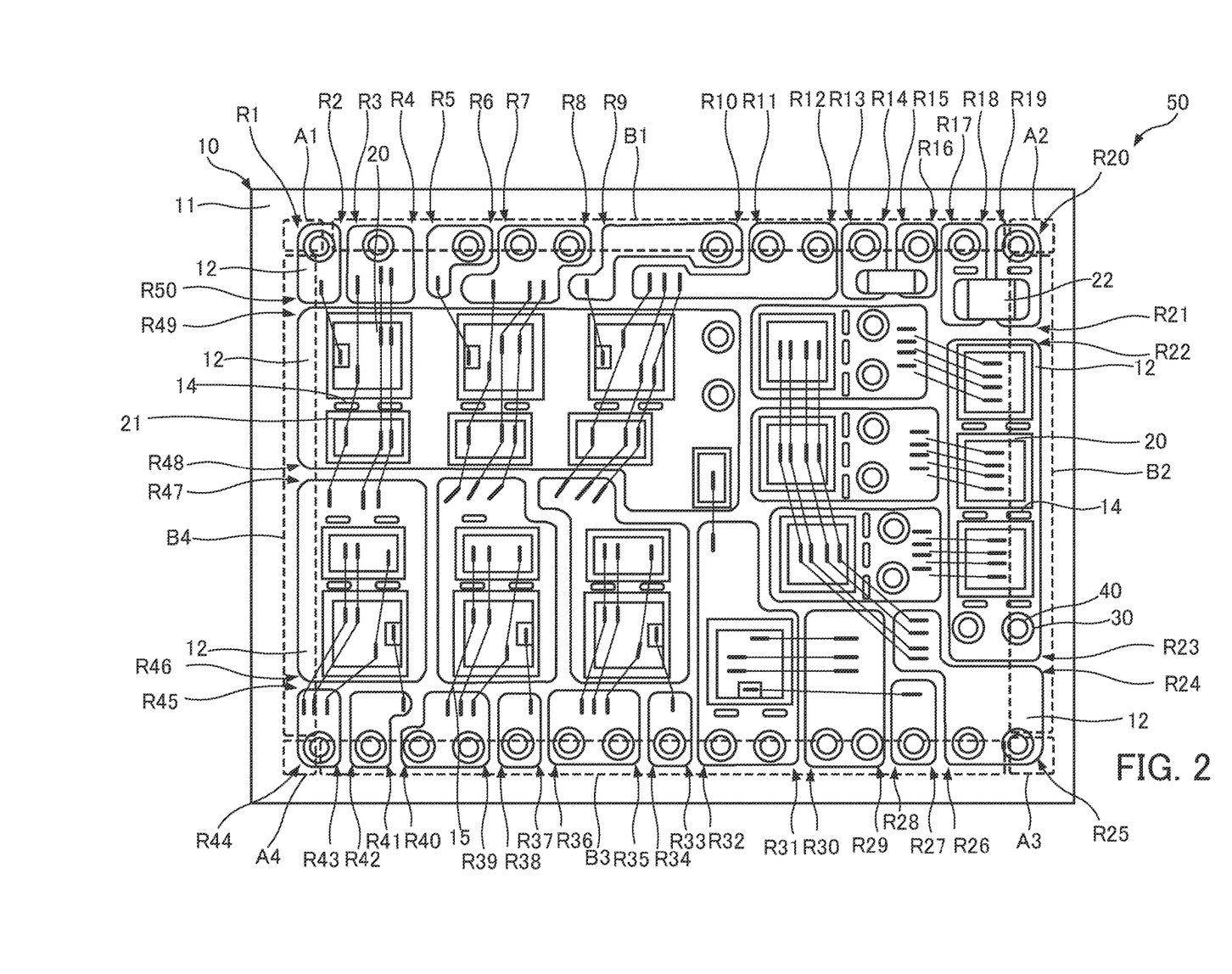
FIG. 2 is a plan view (front surface) of an insulated circuit board provided in a semiconductor device according to the first embodiment.
Figure 3:
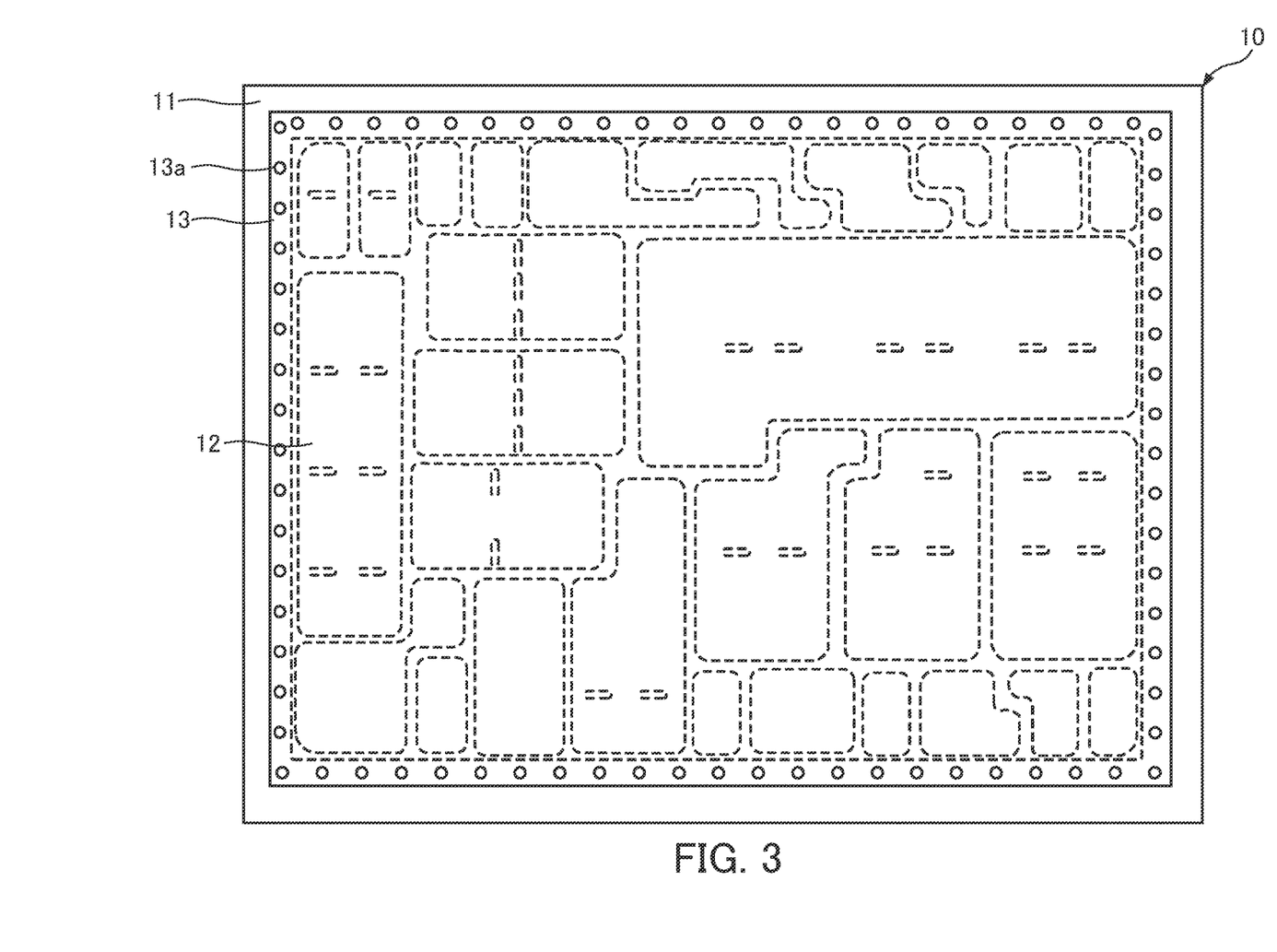
FIG. 3 is a plan view (rear surface) of an insulated circuit board provided in a semiconductor device according to the first embodiment.

A semiconductor device of a first embodiment will be described with reference to FIGS. 1 to 3. FIG. 1 is a side sectional view of a semiconductor device according to the first embodiment. FIG. 2 is a plan view (front surface) of an insulated circuit board provided in a semiconductor device according to the first embodiment. In this connection, a sealing member and a case are not illustrated in FIG. 2. FIG. 3 is a plan view (rear surface) of an insulated circuit board provided in a semiconductor device according to the first embodiment. In this connection, FIG. 3 is a plan view of the rear surface of the insulated circuit board 10 illustrated in FIG. 2. Circuit patterns 12 on the front surface of the insulated circuit board 10 are represented by dotted lines. In addition, in the first embodiment, a plurality of circuit patterns 12 are collectively given the same reference numeral unless otherwise specified, and so are a plurality of semiconductor chips 20 and 21, a plurality of contact parts 30, a plurality of bonding wires 15, and a plurality of external connection terminals 40. Note that a plurality of constitutional components of the same type, other than these, are collectively given the same reference numeral and will be described without distinction among them.

As illustrated in FIGS. 1 and 2, the semiconductor device 50 includes an insulated circuit board 10, and semiconductor chips 20 and 21 and electronic parts 22 joined to the front surface of the insulated circuit board 10. The semiconductor device 50 also includes contact parts 30 joined to the front surface of the insulated circuit board 10. The semiconductor chips 20 and 21, electronic parts 22, and contact parts 30 are joined to the front surface of the insulated circuit board 10 with a joining material (not illustrated) such as solder. In addition, the semiconductor device 50 has bonding wires 15 that electrically connect the front surface of the insulated circuit board 10 and the main electrodes of the semiconductor chips 20 and 21. External connection terminals 40 are press-fitted into the contact parts 30. In the semiconductor device 50, the above components are covered with a case 41. The circumferential edge of the opening of the case 41 is joined to the outer edge of an insulating board 11 included in the insulated circuit board 10 with an adhesive (not illustrated). In this connection, the top ends of the external connection terminals 40 extend upwardly from the case 41. In addition, in the semiconductor device 50, the inside of the case 41 is sealed with a sealing member 42.

The insulated circuit board 10 includes the insulating board 11, a plurality of circuit patterns 12 formed on the front surface of the insulating board 11, and a metal plate 13 formed on the rear surface of the insulating board 11. The insulating board 11 has an insulating property and may be a ceramic substrate or an insulating resin substrate with high thermal conductivity. The ceramic substrate is made of aluminum oxide, aluminum nitride, or silicon nitride, for example. The insulating resin substrate is a paper phenol substrate, a paper epoxy substrate, a glass composite substrate, or a glass epoxy substrate. The thickness of the insulating board 11 ranges from 0.2 mm to 2.5 mm, inclusive.

The plurality of circuit patterns 12 are made of a material with high electrical conductivity. Examples of the material include copper, a copper alloy, and others. The thickness of the individual circuit pattern 12 ranges from 0.1 mm to 2.5 mm, inclusive. To improve corrosion resistance, plating may be performed to form a plating film on the surface of each circuit pattern 12. Examples of the plating material for the plating film include nickel, a nickel-phosphorus alloy, a nickel-boron alloy, and others. A region (first formation region) of the insulating board 11 in which the plurality of circuit patterns 12 are formed is rectangular in plan view.

In addition, as illustrated in FIG. 2, corners of the plurality of circuit patterns facing the outer edge of the insulating board 11 are referred to as outer-edge corners R1 to R50. Corners of the plurality of circuit patterns 12 that do not face the outer edge of the insulating board 11 and are further inside from the outer edge are referred to as inner corners. In addition, portions of the circuit patterns 12 facing the corners of the insulating board are referred to as corner regions A1 to A4. Portions of the circuit patterns 12 facing the outer edge of the insulating board 11, except for the corner regions A1 to A4, are referred to as side regions B1 to B4. That is, the corners of the plurality of circuit patterns 12 include the outer-edge corners R1, R20, R25, and R44 in the corner regions A1 to A4, the outer-edge corners R2 to R19, R21 to R24, R26 to R43, and R45 to R50 in the side regions B1 to B4, and the inner corners. In the rectangular insulating board 11, the plurality of circuit patterns 12 have the outer-edge corners R1, R20, R25, and R44 in the corner regions A1 to A4 corresponding to the four corners of the insulating board 11, the outer-edge corners R2 to R19, R21 to R24, R26 to R43, and R45 to R50 in the side regions B1 to B4 corresponding to the four sides of the insulating board 11, except for the four corners thereof, and the inner corners. Out of the plurality of circuit patterns 12, the circuit patterns 12 having the corner regions A1 to A4 and side regions B1 to B4 are located on the side closer to the outer edge of the insulating board 11. The circuit patterns 12 on the side closer to the outer edge are the ones that each have a portion facing the outer edge of the insulating board 11. The areas of the circuit patterns 12 on the side closer to the outer edge of the insulating board 11 are mostly smaller than those of the circuit patterns 12 on the inner side of the insulating board 11. Especially, many circuit patterns 12 with small areas are located along the long-side direction of the insulating board 11 on the side closer to the outer edge of the insulating board 11.

Most of the contact parts 30 are disposed on the circuit patterns 12 located on the side closer to the outer edge of the insulating board 11 among the plurality of circuit patterns 12. On the other hand, most of the semiconductor chips 20 and 21 are disposed on the circuit patterns 12 located further inside than the circuit patterns 12 located on the side closer to the outer edge among the plurality of circuit patterns 12.

Especially, along the long-side direction of the insulating board 11, the contact parts 30 are provided on the circuit patterns 12 located on the side closer to the outer edge, and the semiconductor chips 20 and 21 are provided further inside than the contact parts 30. In addition, the semiconductor chips 20 and 21 are not provided in the corner regions A1 to A4 or the side regions B1 and B3. The semiconductor chips 20 and 21 are provided further inside than the corner regions A1 to A4 and side regions B1 and B3. The semiconductor chips 20 and 21 are provided on the circuit patterns 12 located further inside than the circuit patterns 12 located on the side closer to the outer edge along the long-side direction of the insulating board 11. In the case where the semiconductor chips 20 and 21 are provided on the circuit patterns 12 located on the side closer to the outer edge along the long-side direction of the insulating board 11, they are placed further inside than the contact parts 30 with grooves 14 therebetween. In addition, the contact parts 30 are provided on the circuit patterns 12 corresponding to the corners of the insulating board 11, but the semiconductor chips 20 and 21 are not provided thereon. The corners of the plurality of circuit patterns 12 will be described in detail later.

In addition, the grooves 14 are formed at appropriate positions in the above circuit patterns 12. The grooves 14 are formed between adjacent disposition regions where the semiconductor chips 20 and 21 are disposed and between such disposition regions and regions which are adjacent to the disposition regions and in which terminals such as the contact parts 30 and electronic parts 22 are disposed.

The metal plate 13 is made of a metal with high thermal conductivity. The metal may be selected from aluminum, iron, silver, copper, an alloy containing at least one of these, and others. In addition, a heat dissipation plate or a cooling unit (not illustrated) may be formed on the rear surface of the metal plate 13. The thickness of the metal plate 13 is the same as that of the plurality of circuit patterns 12 and ranges from 0.1 mm to 2.5 mm, inclusive. In this connection, as illustrated in FIG. 3, the insulating board 11 and metal plate 13 are rectangular in plan view. In addition, in plan view, the area of the metal plate 13 is smaller than that of the insulating board 11, is larger than that of a region where the circuit patterns 12 are formed, and is rectangular. Further, in the metal plate 13, a plurality of dimples (concave depressions) 13a are formed along the outer edge of the metal plate 13 and outside of the region where the circuit patterns 12 are formed in plan view. These dimples 13a are circular, for example, and have a diameter ranging from 50 µm to 1.0 mm, inclusive. Therefore, the insulated circuit board 10 is rectangular. In addition, in the insulated circuit board 10, the total volume of the circuit patterns 12 is less than the volume of the metal plate 13.

The bonding wires 15 provide electrical connections between the semiconductor chips 20 and 21 and the circuit patterns 12 and between the plurality of semiconductor chips 20 and 21. These bonding wires are made of a material with high electrical conductivity. The material may be selected from gold, silver, copper, aluminum, an alloy containing at least one of these, and others. The diameter of the bonding wires 15 ranges from 100 µm to 200 µm, inclusive, or from 350 µm to 500 µm, inclusive, for example.

As the insulated circuit board 10 having the above configuration, a DCB (direct copper bonding) substrate, an AMB (active metal brazed) substrate, or a resin insulated substrate may be used, for example. In addition, as described earlier, to improve the heat dissipation property, a cooling unit (not illustrated) may be attached to the metal plate 13 of the insulated circuit board 10 with a thermal grease such as a silicone thermal grease, containing metal oxide fillers. In this case, the cooling unit is made of aluminum, iron, silver, copper, an alloy containing at least one of these, or another with high thermal conductivity, for example. In addition, as the cooling unit, a heat sink formed with a single fin or a plurality of fins or a cooling device employing water cooling may be used.

The semiconductor chips 20 include power device elements made of silicon or silicon carbide. The power device elements are switching elements such as IGBTs and power MOSFETs, for example. Such semiconductor chips 20 each have a drain electrode (or collector electrode) serving as a main electrode on its rear surface and also have a gate electrode and a source electrode (or emitter electrode) serving as a main electrode on its front surface. In addition, the semiconductor chips 21 may include diodes such as SBDs (Schottky barrier diodes) and FWDs (freewheeling diodes). Such semiconductor chips 21 each have a cathode electrode serving as a main electrode on its rear surface and an anode electrode serving as a main electrode on its front surface. The rear surfaces of the above semiconductor chips 20 and 21 are joined to prescribed circuit patterns 12. In this connection, the semiconductor chips 20 and 21 are soldered to the circuit patterns 12 (the solder is not illustrated). The solder is basically lead-free solder mainly containing one of a tin-silver alloy, a tin-antimony alloy, a tin-zinc alloy, and a tin-copper alloy. An additive may be added to the solder. The additive may be selected from copper, bismuth, indium, nickel, germanium, cobalt, and silicon, for example. In addition, RC (reverse-conducting)-IGBT chips that each integrate an IGBT and an FWD may be used, in place of the semiconductor chips 20 and 21, although this variation is not illustrated. In addition, in place of the semiconductor chips 20 and 21, a lead frame, external connection terminals (pin terminals, contact parts, and others), electronic parts (thermistors, current sensors), and others may be disposed according to necessity, for example. In this connection, the thicknesses of the above semiconductor chips 20 and 21 range from 180 µm to 220 µm, inclusive, for example, and are averaged at about 200 µm. The electronic parts 22 include capacitors, resistors, thermistors, current sensors, control ICs (integrated circuits), and others.

Each contact part 30 has a main body with a cylindrical through-hole formed therein and a flange formed along the opening end of the main body. The contact parts 30 are made of a metal with high electrical conductivity. The metal may be selected from silver, copper, nickel, and an alloy containing at least one of these, for example. To improve corrosion resistance, for example, plating may be performed to form a plating film on the surface of each contact part 30. Examples of the plating material for the plating film include nickel, a nickel-phosphorus alloy, and a nickel-boron alloy. In each contact part 30, the radius at the opening end of the through-hole ranges from 0.1 mm to 1.0 mm, inclusive. In addition, the radius of the outer circumference of the flange at the opening end ranges from 0.5 mm to 2.0 mm, inclusive.

Each external connection terminal 40 has a rod-shaped main body and a tapered tip end formed at the both ends of the main body. The main body is column-shaped. The length of a diagonal line of the cross section of each external connection terminal 40 is several percent longer than the diameter of the main body of a contact part 30. This setting allows the external connection terminal 40 to be press-fitted into the contact part 30. In addition, the external connection terminals 40 are made of a metal with high electrical conductivity. The metal may be selected from silver, copper, nickel, and an alloy containing at least one of these, for example.

The case 41 is box-shaped and is made of a thermoplastic resin. Examples of the thermoplastic resin include PPS resin, PBT resin, PBS resin, PA resin, ABS resin, and others. In addition, the case has opening holes (not illustrated) to allow the external connection terminals 40 to extend outwardly from the case 41. The circumferential edge of the opening of the case 41 is joined to the outer edge of the insulating board 11 of the insulated circuit board 10 with an adhesive.

The sealing member 42 may be silicone gel, for example. In addition, the sealing member 42 may contain a thermosetting resin, such as an epoxy resin, a phenolic resin, or a maleimide resin, and a filler contained in a thermosetting resin, for example. An example of the sealing member 42 contains an epoxy resin and a filler such as a silicon dioxide, an aluminum oxide, a boron nitride, an aluminum nitride, or another which is mixed with the epoxy resin.

The following describes the case where the curvatures of the corners of the plurality of circuit patterns 12 are equal to each other in the insulated circuit board 10. The insulating board 11, circuit patterns 12, and metal plate 13 have different thermal expansion coefficients. In addition, the metal plate 13 and the plurality of circuit patterns 12 have the same thickness, and in plan view, the area of the metal plate 13 is larger than that of the formation region where the plurality of circuit patterns 12 are formed. That is to say, with respect to the insulating board 11, the volume of the metal plate 13 is greater than the total volume of the plurality of circuit patterns 12. For example, the volume of the metal plate 13 is greater by 10% or more and 100% or less than the total volume of the plurality of circuit patterns 12. If the insulated circuit board 10 is subjected to thermal cycles, the insulating board 11 is damaged by thermal stress due to the differences in thermal expansion coefficient. Especially, in the insulated circuit board 10, the circuit patterns 12 on the side closer to the outer edge of the insulating board 11 among the plurality of circuit patterns 12 are mostly smaller than the circuit patterns 12 located on the inner side of the insulating board 11. Therefore, high thermal stress occurs in the outer edge of the insulating board 11. In addition, in the outer edge of the insulating board 11, higher thermal stress occurs at the corners than in the sides.

To avoid this, in the plurality of circuit patterns 12 of the insulated circuit board 10 in the first embodiment, the curvatures of the outer-edge corners R1 to R50 facing the outer edge of the insulating board 11 are made smaller than those of the inner corners that do not face the outer edge of the insulating board 11. In addition, out of the curvatures of the outer-edge corners R1 to R50, the curvatures of the outer-edge corners R1, R20, R25, and R44 corresponding to the corners of the insulating board 11 are made smaller than those of the outer-edge corners R2 to R19, R21 to R24, R26 to R43, and R45 to R50 that do not correspond to the corners of the insulating board 11. That is, with respect to the curvatures of the corners of the plurality of circuit patterns 12, the inner corners have the largest curvatures, the outer-edge corners R2 to R19, R21 to R24, R26 to R43 and R45 to R50 in the side regions B1 to B4 have the next largest curvatures, and the outer-edge corners R1, R20, R25, and R44 in the corner regions A1 to A4 have the smallest curvatures.

Figure 4:
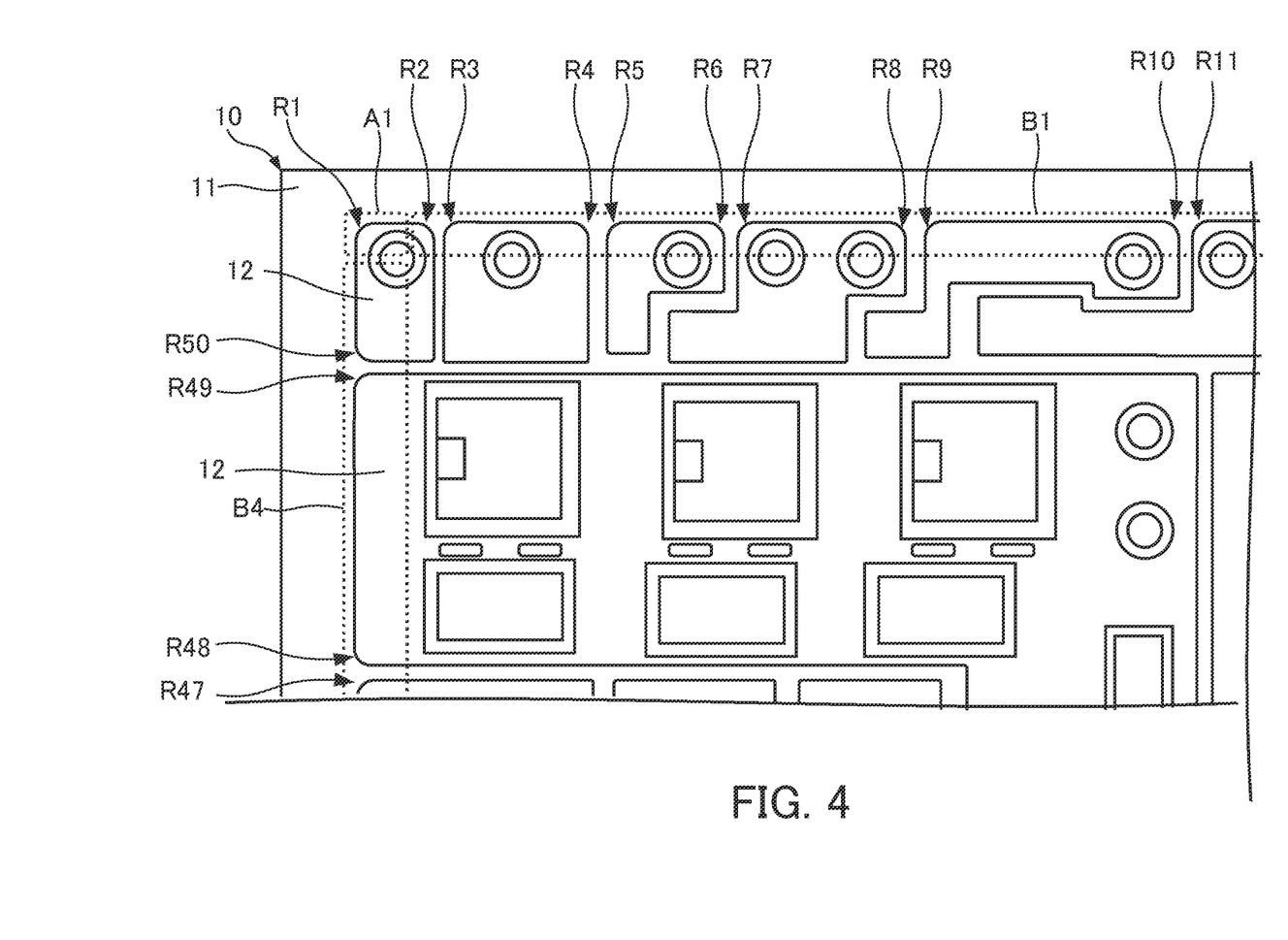
FIG. 4 is an enlarged plan view of a part of an insulated circuit board according to the first embodiment.

This curvature setting will be described in detail with reference to FIG. 4. FIG. 4 is an enlarged plan view of a part of an insulated circuit board according to the first embodiment. In this connection, FIG. 4 is an enlarged view of the upper left part of FIG. 2. Note that the bonding wires 15, semiconductor chips 20 and 21, and contact parts 30 are not illustrated in FIG. 4. Referring to FIG. 4, the outer-edge corners R1 to R11 and R47 to R50 of the circuit patterns 12 in the corner region A1 and side regions B1 and B4 have smaller curvatures than inner corners other than these. In addition, out of the outer-edge corners R1 to R11 and R47 to R50, the outer-edge corner R1 in the corner region A1 has a smaller curvature than the outer-edge corners R2 to R11 and R47 to R50 in the side regions B1 and B4. For example, the curvature radius r of the outer-edge corner R1 is approximately 1.0 mm, and the curvature radii r of the outer-edge corners R2 to R11 and R47 to R50 are approximately 0.8 mm. In addition, the curvature radii r of the corners (inner corners) of the circuit patterns 12 in the region other than the corner region A1 and side regions B1 and B4 are approximately 0.5 mm. The curvature radius r of the outer-edge corner R1 is 0.8 mm or larger and preferably ranges from 0.8 mm to 1.1 mm, inclusive. The curvature radii r of the outer-edge corners R2 to R11 and R47 to R50 are 0.6 mm or larger and preferably range from 0.6 mm to 0.9 mm, inclusive. In addition, the curvature radii r of the corners (inner corners) of the circuit patterns 12 in the region other than the corner region A1 and side regions B1 and B4 are 0.3 mm or larger and preferably range from 0.3 mm to 0.7 mm, inclusive. The above setting reduces the occurrence of cracks in the insulated circuit board 10 and also ensures areas needed for electrodes. In addition, although not illustrated in FIG. 4, the curvatures of the outer-edge corners R12 to R46 in the corner regions A2 to A4 and side regions B1 to B4 are also smaller than those of the corners (inner corners) of the circuit patterns 12 located on the inner side of the insulating board 11. Furthermore, the curvatures of the outer-edge corners R20, R25, and R44 in the corner regions A2 to A4 are smaller than those of the outer-edge corners R12 to R19, R21 to R24, R26 to R43, R45, and R46 in the side regions B1 to B4. This setting reduces thermal stress that is generated in the outer edge of the insulating board 11 in the insulated circuit board 10. In the outer edge of the insulating board 11, higher thermal stress that is generated at the corners is reduced.

In addition, a contact part 30 is disposed on the circuit pattern 12 including the corner region A1. The joining area of the contact part 30 is circular in plan view. This makes it possible to efficiently use the region of the front surface of the circuit pattern 12 with small curvatures. On the other hand, the semiconductor chips 20 and 21 are not disposed on the circuit pattern 12 including the corner region A1. The joining areas of the semiconductor chips 20 and 21 are rectangular in plan view. Therefore, it is not possible to dispose the semiconductor chips 20 and 21 in the vicinity of the corners in the region of the front surface of circuit patterns 12 with small curvatures. To dispose a semiconductor chip 20, 21, a large area that matches the shape of its joining area is needed. Therefore, it is preferable to dispose the contact parts 30 on the circuit patterns 12 including the corner region A1 and side regions B1 and B4. On the other hand, it is preferable not to dispose the semiconductor chips 20 and 21 on the circuit patterns 12 including the corner region A1 and side regions B1 and B4, but to dispose them on circuit patterns 12 located further inside than the circuit patterns 12 including the corner region A1 and side regions B1 and B4. By disposing the semiconductor chips 20 and 21 and contact parts 30 according to the circuit patterns 12 having different corner curvatures, as described above, it becomes possible to efficiently use the regions of the front surfaces of the circuit patterns 12.

The above-described semiconductor device 50 has the insulated circuit board 10 that includes the insulating board 11 and a plurality of circuit patterns 12 formed on the front surface of the insulating board 11. Out of the curvatures of the outer-edge corners R1 to R50 of the plurality of circuit patterns 12 facing the outer edge of the insulating board 11, the curvatures of the outer-edge corners R1, R20, R25, and R44 corresponding to the corners of the insulating board 11 are small. This makes it possible to reduce thermal stress that is generated in the outer edge of the insulating board 11. Especially, in the outer edge of the insulating board 11, higher thermal stress that is generated at the corners is reduced. Therefore, the occurrence of damage in the insulated circuit board 10 is reduced and thus a decrease in the reliability of the semiconductor device 50 is prevented.

Second Embodiment

Figure 5A:
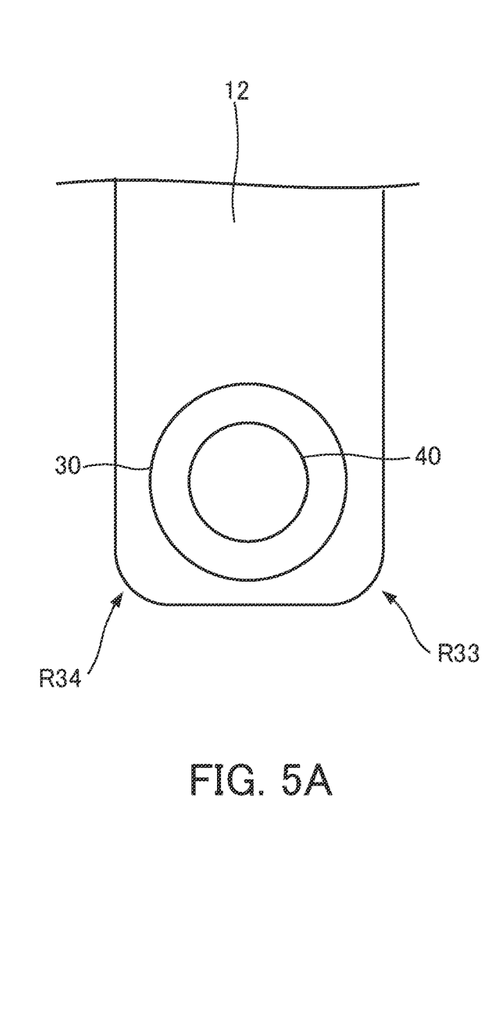
FIGS. 5A to 5C are plan views of a circuit pattern in an insulated circuit board provided in a semiconductor device according to a second embodiment.
Figure 5B:
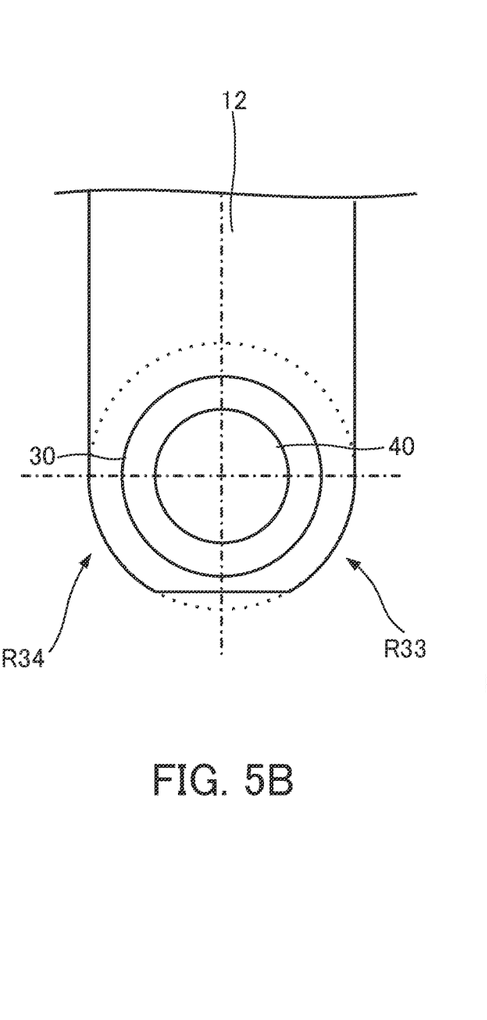
Figure 5C:
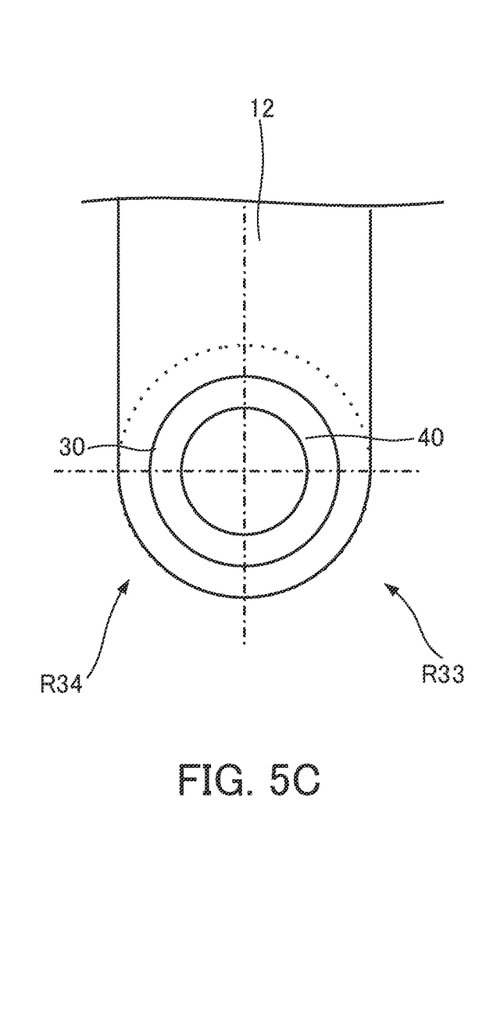

The second embodiment describes other configurations of the circuit patterns 12 included in the insulated circuit board 10 of the first embodiment with reference to FIGS. 5A to 5C. In this connection, a semiconductor device of the second embodiment has the same configuration as that of the first embodiment, except for circuit patterns 12 to be described below. FIGS. 5A to 5C are plan views of a circuit pattern in an insulated circuit board provided in the semiconductor device of the second embodiment. The circuit patterns 12 illustrated in FIGS. 5A to 5C are applicable for any circuit pattern 12 which is provided along the outer edge of an insulating board 11 and on which a contact part 30 is disposed. As an example, FIGS. 5A to 5C illustrate three types of circuit patterns 12 each including the outer-edge corners R33 and R34 of FIG. 2.

As described in the first embodiment, in the plurality of circuit patterns 12, the curvatures of the outer-edge corners R1 to R50 in the corner regions A1 to A4 and side regions B1 to B4 are smaller than those of the inner corners of the circuit patterns 12. However, if the curvatures of the outer-edge corners R1 to R50 are made too small, the areas of the circuit patterns 12 including the outer-edge corners R1 to R50 are limited. To deal with this, the outer-edge corners of a circuit pattern 12 on which a contact part 30 is disposed are each made to have a curvature radius that is larger than or equal to the curvature radius of the outer circumference at the opening end of the contact part 30 and that is less than or equal to a curvature radius that is equal to half the width of the circuit pattern 12 on which the contact part 30 is disposed. For example, FIG. 5A illustrates the case where the curvature radii of the outer-edge corners R33 and R34 of the circuit pattern 12 are approximately equal to the curvature radius of the outer circumference at the opening end of the contact part 30. FIG. 5B illustrates the case where the curvature radii of the outer-edge corners R33 and R34 of the circuit pattern 12 are approximately equal to a curvature radius that is equal to half the width of the circuit pattern 12 on which the contact part 30 is disposed. FIG. 5C illustrates the case where the tip end of the circuit pattern 12 has a shape approximately the same as a concentric circle centered at the center of the opening of the contact part 30. In all the cases of FIGS. 5A to 5C, the contact part 30 is disposed at the center in the width direction of the circuit pattern 12. In addition, the curvatures of the outer-edge corners (and tip end) of the circuit pattern 12 on which the contact part 30 is disposed are set according to the outer circumference of the opening end of the contact part 30. This setting makes it possible to reduce the curvatures of the outer-edge corners without limiting the disposition region for the contact part 30.

According to one aspect, a semiconductor device is provided, which reduces the occurrence of damage in an insulated circuit board and thus prevents a decrease in reliability.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device, comprising:
    an insulated circuit board, including
        an insulating board having an outer edge and a plurality of corners, and
        a plurality of circuit patterns formed on a front surface of the insulating board, the plurality of circuit patterns having a plurality of outer-edge corners facing the outer edge of the insulating board, among which outer-edge corners corresponding to the corners of the insulating board are smaller in curvature than outer-edge corners that do not correspond to the corners of the insulating board.

2. The semiconductor device according to claim 1, wherein the plurality of circuit patterns are formed in a first formation region that is rectangular in a plan view of the semiconductor device.

3. The semiconductor device according to claim 2, wherein the plurality of circuit patterns further include a plurality of inner corners that are larger in curvature than the outer-edge corners.

4. The semiconductor device according to claim 2, wherein:
    the insulated circuit board further includes a metal plate formed in a second formation region on a rear surface of the insulating board; and
    the first formation region is within the second formation region in the plan view.

5. The semiconductor device according to claim 1, wherein:
    the insulated circuit board further includes a metal plate formed on a rear surface of the insulating board; and
    a total volume of the plurality of circuit patterns is less than a volume of the metal plate.

6. The semiconductor device according to claim 1, wherein surfaces of the plurality of circuit patterns are each plated with a plating material.

7. The semiconductor device according to claim 1, further comprising a semiconductor chip, wherein
    the plurality of circuit patterns include a plurality of first circuit patterns and a plurality of second circuit patterns, wherein
        the plurality of first circuit patterns are located closer to a center of the insulating board than the plurality of second circuit patterns,
        the semiconductor chip is disposed on one of the plurality of first circuit patterns,
        the plurality of second circuit patterns are located around the outer edge of the insulating board, and
        each of the outer-edge corners is a corner of one of the second circuit patterns.

8. The semiconductor device according to claim 7, further comprising:
    an external connection terminal; and
    a cylindrical contact part which is disposed on one of the plurality of second circuit patterns and in which the external connection terminal is press-fitted, wherein
    the one second circuit pattern on which the contact part is disposed has a corner that is one of the outer-edge corners, said corner having a curvature radius that is
        larger than or equal to a curvature radius of the contact part, and
        smaller than or equal to a half of a width of the one second circuit pattern on which the contact part is disposed.

9. The semiconductor device according to claim 8, at least one of the plurality of second circuit patterns is smaller in area than each of the plurality of first circuit patterns.

10. The semiconductor device according to claim 9, wherein:
    the insulated circuit board further includes a metal plate formed on a rear surface of the insulating board; and
    the rear surface of the metal plate has a plurality of concave depressions formed therein, the plurality of concave depressions being located further away from the center of the insulating board than the plurality of second circuit patterns in a plan view of the semiconductor device.

11. The semiconductor device according to claim 1, wherein each of the outer-edge corners corresponding to the corners of the insulating board is a corner of the circuit patterns that is closest to one of the corners of the insulating board.

12. A semiconductor device, comprising:
a contact part; and
an insulated circuit board including
an insulating board having an outer edge, and
a plurality of circuit patterns formed on a front surface of the insulating board, the plurality of circuit patterns including a first circuit pattern located on the outer edge of the insulating board, wherein
the contact part is disposed on the first circuit pattern, and
the first circuit pattern has an outer-edge corner facing the outer edge of the insulating board, the outer-edge corner having a curvature radius that is
larger than or equal to a curvature radius of the contact part, and
smaller than or equal to a half of a width of the first circuit pattern.

\* \* \* \* \*